(12) United States Patent
Okubora

(10) Patent No.: US 7,599,190 B2
(45) Date of Patent: Oct. 6, 2009

(54) HIGH-FREQUENCY MODULE, AND METHOD OF PRODUCING SAME

(75) Inventor: Akihiko Okubora, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/502,117

(22) PCT Filed: Jan. 24, 2003

(86) PCT No.: PCT/JP03/00684

§ 371 (c)(1),
(2), (4) Date: Jul. 21, 2004

(87) PCT Pub. No.: WO03/063238

PCT Pub. Date: Jul. 31, 2003

(65) Prior Publication Data

US 2005/0146403 A1    Jul. 7, 2005

(30) Foreign Application Priority Data

Jan. 25, 2002    (JP) ............................. 2002-017620

(51) Int. Cl.
*H05K 7/02* (2006.01)
*H05K 7/06* (2006.01)
*H05K 7/08* (2006.01)
*H05K 7/10* (2006.01)

(52) U.S. Cl. ..................... 361/760; 361/763; 361/765; 361/795

(58) Field of Classification Search ......... 361/763–766, 361/782–783, 792–795; 333/33–35; 257/685–687
See application file for complete search history.

(56) References Cited

U.S. PATENT DOCUMENTS

| | | | | |
|---|---|---|---|---|
| 5,373,112 A | * | 12/1994 | Kamimura et al. | 174/255 |
| 5,488,542 A | * | 1/1996 | Ito | 361/793 |
| 5,764,119 A | * | 6/1998 | Miyagi et al. | 333/238 |
| 5,877,550 A | * | 3/1999 | Suzuki | 257/700 |
| 5,929,510 A | * | 7/1999 | Geller et al. | 257/635 |
| 6,183,669 B1 | * | 2/2001 | Kubota et al. | 156/89.16 |
| 6,531,775 B1 | * | 3/2003 | Kobayashi et al. | 257/728 |
| 6,535,398 B1 | * | 3/2003 | Moresco | 361/792 |
| 6,734,542 B2 | * | 5/2004 | Nakatani et al. | 257/687 |

FOREIGN PATENT DOCUMENTS

| | | |
|---|---|---|
| JP | 03-166930 | 7/1991 |
| JP | 05-338034 | 12/1993 |
| JP | 09-260797 | 10/1997 |
| JP | 10-117048 | 5/1998 |
| JP | 2000-044776 | 2/2000 |
| JP | 2000-265039 | 9/2000 |
| JP | 2000-340904 | 12/2000 |

* cited by examiner

*Primary Examiner*—Tuan T Dinh
(74) *Attorney, Agent, or Firm*—Robert J. Depke; Rockey, Depke & Lyons, LLC

(57) ABSTRACT

A high-frequency module having a communication function is provided which includes a base substrate block (2) formed from organic substrates (11, 12), the organic substrate (11) having wiring layers (14, 15) formed on main sides, respectively, thereof while the organic substrate (12) has wiring layers (16, 17) formed on main sides, respectively, thereof, the base substrate block (2) having a buildup surface formed by flattening an uppermost layer, and an elements block (3) formed from organic insulative layers (26, 28) formed on the buildup surface of the base substrate block (2) and in which a plurality of conductive parts (19, 20, 32) forming passive elements and distributed parameter elements, which transmit a high-frequency signal, are formed along with wiring layers (27, 29). The conductive parts (19, 20, 32) in the elements block (3) are formed correspondingly to portions of the organic substrate (11) in the base substrate block (2) where no woven glass fabric is laid.

11 Claims, 13 Drawing Sheets

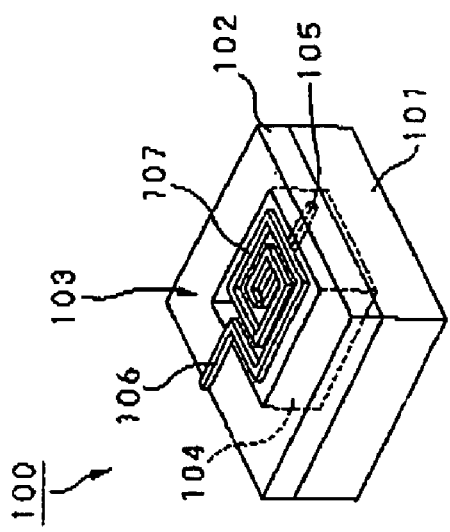
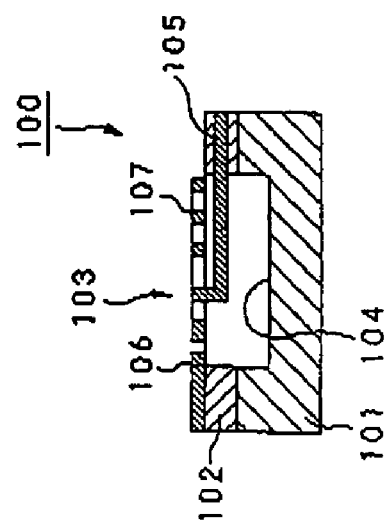
FIG. 1A PRIOR ART
FIG. 1B PRIOR ART

HIGH-FREQUENCY MODULE, AND METHOD OF PRODUCING SAME

TECHNICAL FIELD

The present invention relates to a high-frequency module having functions of information communication and storage and which is to be installed fixedly or removably as an ultra-small communication module in an electronic device such as a personal computer, personal digital assistant, mobile phone or an audio device to provide an ultra-compact communication module, and a method of producing the high-frequency module.

This application claims the priority of the Japanese Patent Application No. 2002-017620 filed on Jan. 25, 2002, the entirety of which is incorporated by reference herein.

BACKGROUND ART

Conventionally, audio or video information is digitized for easy treatment in a personal computer, various mobile electronic devices or the like. Namely, digital data can easily be recorded, reproduced or transmitted without being deteriorated in quality. Such digital audio or video information can have its frequency band compressed with the audio and video codec techniques for easier and more efficient distribution to a variety of communication terminals via digital communication and broadcasting. For example, audio and video data (AV data) can be received by a mobile phone out of doors.

Recently, transmission/reception systems for such digital information are practically used in various manners since there have been proposed network systems suitable for outdoor use as well as for use in a small-scale area. As such network systems, there have been proposed, in addition to a week radio-wave system using a frequency band of 400 MHz and personal handy-phone system (PHS) using a frequency band of 1.9 GHz, various types of next-generation radio communication systems including a radio LAN system using a frequency band of 2.45 GHz and small-scale radio communication system called "Bluetooth", both proposed in IEEE 802.11b, and a narrow-band radio communication system using a frequency band of 5 GHz proposed in IEEE 802.11a. With the effective use of such various radio communication system and also various types of communication terminals, the digital information transmission/reception systems can transfer and receive various kinds of data by various types of communication terminals in various places, for example, in doors, out of doors or the like, access a communication network such as the Internet, and transmit and make data transmission and reception to and from the communication network. However, the above data communications can be done easily, not via any repeater or the like.

For the digital information transmission/reception systems, however, the communication terminal having the above communication functions should essentially be compact and lightweight, and portable. Since the communication terminal has to modulate and demodulate analog high-frequency signals in a transmission/reception block thereof, so it generally includes a high-frequency transmission/reception circuit of a superheterodyne type designed to convert the signal frequency into an intermediate frequency once for transmission or reception.

The high-frequency transmission/reception circuit includes an antenna block having an antenna and a select switch and which receives or transmits information signals, and a transmission/reception selector which makes a selection between transmission and reception modes of operation. The high-frequency transmission/reception circuit also includes a reception circuit block composed of a frequency convert circuit, demodulation circuit, etc. The high-frequency transmission/reception circuit further includes a transmission circuit block composed of a power amplifier, drive amplifier, modulation circuit, etc. The high-frequency transmission/reception circuit also includes a reference frequency generation circuit block which supplies a reference frequency to the reception and transmission circuit blocks.

The above-mentioned high-frequency transmission/reception circuit is composed of many parts including large functional components such as various filters interposed between stages, local oscillator (VCO), surface acoustic wave (SAW) filter and the like, and passive components such as an inductor, capacitor, resistor and the like provided peculiarly to high-frequency analog circuits like a matching circuit, bias circuit, etc. In the high-frequency transmission/reception circuit, each of the circuit blocks is implemented in IC-chip form. However, since each of the filters interposed between the stages cannot be assembled in any IC, the matching circuit has to be provided as an external device for the high-frequency transmission/reception circuit. Therefore, the high-frequency transmission/reception circuit as a whole is so large that the communication terminal cannot be designed compact and lightweight.

On the other hand, some communication terminals use a direct conversion-type high-frequency transmission/reception circuit which transmits and receives information signals without conversion of the signal frequency into an intermediate frequency. In this high-frequency transmission/reception circuit, information signals received by the antenna block are supplied through the transmission/reception selector to the demodulation circuit where they will undergo a direct baseband processing. In the high-frequency transmission/reception circuit, information signals generated by a source have the frequency thereof not converted once by the modulation circuit into any intermediate frequency but modulated directly to a predetermined frequency band, and sent from the antenna block via the amplifier and transmission/reception selector.

Since the above high-frequency transmission/reception circuit is constructed to transmit and receive information signals with the direction modulation of the signal frequency but without conversion of the signal frequency into any intermediate frequency, it can be composed of a reduced number of parts such as the filter etc. so simply as to have a generally one-chip construction. Also, in the high-frequency transmission/reception circuit of the direct conversion type, something has to be done about the filter or matching circuit provided in the downstream stage. In the high-frequency transmission/reception circuit, since signals are amplified once in the high-frequency stage, so it is difficult to make a sufficient gain. Therefore, it is necessary to make amplification of the signals in the baseband processing block as well. Therefore, a DC offset cancel circuit and an extra lowpass filter have to be provided in the high-frequency transmission/ reception circuit, which will lead to a larger total power consumption.

The conventional high-frequency transmission/reception circuit, whether of the aforementioned superheterodyne type or of the direct conversion type, does not meet the requirements for the compact and lightweight design of the communication terminals. On this account, various approaches have been made to design a more compact and lightweight high-frequency transmission/reception circuit by designing a simple-construction high-frequency transmission/reception module with the Si-CMOS technique, for example. In a typical example of such approaches, the high-frequency module is built in a one-chip form by forming passive elements each having a good performance on an Si substrate while forming a filter circuit and resonator in an LSI and integrating an logic LSI for the baseband processing circuit. Since the Si substrate is electrically conductive, however, it is difficult to form an inductor and capacitor each having a high Q value on the main side of the Si substrate. In this case, such approaches essentially depend upon how higher-performance passive elements are formed on the Si substrate.

FIGS. 1A and 1B show together a conventional high-frequency module. The high-frequency module is generally indicated with a reference 100. It includes a silicon substrate 101, $SiO_2$ insulative layer 102, first wiring layer 105, second wiring layer 106 and an inductor 107. The assembly of the silicon substrate 101 and $SiO_2$ insulative layer 102 has formed therein a large concavity 104 which defines a place (indicated at a reference 103) where the inductor 107 is to be formed. The first wiring layer 105 is formed in the concavity 104. The second wiring layer 106 is formed on the top of the silicon layer 101 and the inductor 107 itself is provided over the concavity 104. Since the inductor 107 faces the concavity 104 and is supported by the second wiring layer 106 in air over the concavity 103, so its electrical interference with the circuit inside via the silicon substrate 101 is smaller, and thus the high-frequency module 100 has an improved performance. However, the inductor 107 included in this high-frequency module 100 is formed through many difficult processes and with an increased manufacturing cost.

FIG. 2 shows a conventional silicon substrate. As shown, the silicon substrate, generally indicated with a reference 110, includes a silicon substrate 111, $SiO_2$ layer 112 formed on the silicon substrate 111, and a passive element forming layer 113 formed on the SiO2 layer 111 by the photolithography. The high-frequency module 110 has passive elements such as an inductor, capacitor or resistor formed in multiple layers, each along with a wiring element, in the passive element forming layer 113 with the thin and thick film technologies, which will not be described in detail herein. In the high-frequency module 110, the passive element forming layer 113 has viaholes 114 formed appropriately therethrough to provide an interlayer connection and a terminal 115 formed on the surface layer thereof. A chip 116 such as a high-frequency IC, LSI or the like is mounted on the high-frequency module 110 on contact with the terminal 115 by the flip chip bonding or the like to form a high-frequency circuit.

Such a high-frequency module 110 is mounted on an interposer circuit board or the like having a base-band processing circuit and the like formed thereon to make an isolation between the passive element forming layer and base-band processing circuit by means of the silicon layer 111, thereby permitting to suppress an electric interference between the passive element forming layer and base-band processing circuit. Since the silicon layer 111 is electrically conductive, the high-frequency module 110 can effectively function when a high-precision passive element is formed in the passive element forming layer 113. On the other hand, however, the silicon layer 111 being electrically conductive will inhibit each of passive elements from a having good high-frequency performance.

FIG. 3 shows another conventional high-frequency module. The high-frequency module, generally indicated with a reference 120, uses a substrate 121 not electrically conductive such as a glass substrate or ceramic substrate to solve the problems of the aforementioned silicon substrate 111. As shown, this high-frequency module 120 includes a substrate 121 and a passive element forming layer 122 formed on the substrate 121 by photolithography. Similarly to the aforementioned conventional high-frequency module 110, the high-frequency module 120 has passive elements such as an inductor, capacitor or resistor formed in multiple layers, along with a wiring element, in the passive element forming layer 122 with the thin and thick film technologies, which will not be described in detail herein. In the high-frequency module 120, the passive element forming layer 122 has a viahole 123 formed appropriately therethrough for an interlayer connection, and a terminal 124 formed on the surface layer thereof. A high-frequency IC 125, chip-shaped part 126 and the like are mounted on the high-frequency module 120 with the terminal 124 laid between them by the flip chip bonding or the like to form a high-frequency circuit.

In the high-frequency module 120 shown in FIG. 3, since use of the substrate 121 not electrically conductive permits to suppress the capacitive coupling between the substrate 121 itself and passive element forming layer 122, a passive element having a good high-frequency performance can be formed in the passive element forming layer 122. In case the high-frequency module 120 is formed from a glass substrate, however, it is difficult because of the characteristic of the glass substrate to form, on the substrate 121 itself, terminals by which the high-frequency module 120 is connected to an interposer substrate 127, for example, when it is mounted on the latter. On this account, in the high-frequency module 120, a terminal pattern 128 is appropriately formed on the surface of the passive element forming layer 122, and the terminal pattern 128 and a terminal pattern 129 appropriately formed at the interposer substrate 127 are connected to each other by a wire 130 with the wire bonding technique or the like, as shown in FIG. 4. It should be noted that the interposer substrate 127 has appropriately formed on the bottom thereof an input/output terminal 131 connected to the terminal pattern 128 through viaholes (not shown).

The above high-frequency module 120 is not advantageous in that the terminal patterns 128 and 129 have to be formed and connected by wire bonding to each other, which will increase the cost of manufacturing and make it difficult to attain a more compact module design. It should be noted that the high-frequency module 120 is packaged with the terminal patterns 128 and 129 or the wire 130 being sealed along with high-frequency IC 125 and chip-shaped part 126 in an insulative resin 132.

On the other hand, in case the high-frequency module 120 is formed from a ceramic substrate, it functions as a package board on no contact with any mother board because a base ceramic substrate can be formed in multiple layers. Since the ceramic substrate is formed from sintered ceramic particles, however, it will have, on a surface thereof where the passive element forming layer 122 is formed, a roughness as large as the ceramic particle size of about 2 to 10 μm. Therefore, to form high-precision passive elements in the high-frequency module 120, the ceramic layer surface has to be flattened by polishing before forming the passive element forming layer 122. Also, since the ceramic substrate has a relatively high specific inductive capacity (8 to 10 in case the ceramic substrate is of alumina, and 5 to 6 in case it is of glass ceramic) while it is low in loss, so the high-frequency module 120 will incur interference between multiple layers of wiring, be lower in reliability and less immune to noises.

To solve the problems of the aforementioned conventional high-frequency modules, the Applicant of the present invention proposed another high-frequency module as shown in FIG. 5. The high-frequency module, generally indicated with a reference 140, includes a base substrate block 141 and a block in which elements are formed (will be referred to as "elements block" hereunder) 142 stacked on the base substrate block 141. The base substrate block 141 is formed from first and second organic substrates 143 and 144 each low in loss because of their low specific inductive capacity and dielectric dissipation factor (Tan δ), and the first and second organic substrates 143 and 144 are bonded integrally to each other with a prepreg 145.

The first and second organic substrates 143 and 144 are formed from a material having the aforementioned characteristics, selected from among organic materials including liquid crystal polymer, benzocyclobutene, polymide, polynorbornen, polyphenylether, polytetrafluoroethylene, bismaleimide-triazine (BT-resin) and any one of these resins having ceramic powder dispersed therein, with the material being integrated with woven glass fabrics 146a and 146b each as a core to assure an improved bending strength, rupture strength, etc.

The base substrate block 141 has a wiring layer formed, with the printed-circuit board technique, on the main side, top or bottom, of each of the first and second organic substrates 143 and 144 to form first to fourth wiring layers 147 to 150. Of the base substrate block 141, the first to fourth wiring layers 147 to 150 are interlayer-connected to each other through viaholes 151 appropriately formed through the layers 147 to 150. The first and second wiring layers 147 and 148 are formed on the top and bottom main sides, respectively, of the first organic substrate 143, while the third and fourth wiring layers 149 and 150 are formed on the top and bottom sides, respectively, of the second organic substrate 144. The high-frequency module 140 has formed inside the base substrate block 141 thereof line patterns 152a and 152b each formed from a distributed parameter circuit including a resonator, filter, etc. or a power circuit, bias circuit, etc. which will not be described in detail.

The high-frequency module 140 shown in FIG. 5 has a passive element 153, inductor 154, passive element 155 or the like formed in the elements block 142 with the thin film technology. In the high-frequency module 140, a high-frequency IC 156 is mounted on the surface of the element forming layer 142 by the flip chip bonding. To efficiently form the line patterns 152a and 152b, power circuit or bias circuit formed in the base substrate block 141 and the passive elements 153 to 155 formed in the element forming layer 142 as above and avoid interference between the elements, the high-frequency module 140 has the first and third wiring layers 147 and 149 formed each as a grounding layer.

Note that the high-frequency module 140 shown in FIG. 5 is packaged with the wiring pattern formed on the surface of the elements block 142 being covered with a protective layer 157 while the high-frequency module 140 and a high-frequency IC 156 are wholly covered with an insulative resin layer (not shown). The high-frequency module 140 has a plurality of terminal blocks 158 formed in the fourth wiring layer 150, and mounted on an interposer (not shown) with the terminal blocks 158 being positioned between them.

The high-frequency module 140 shown in FIG. 5 is characterized in that since the first and second organic substrates 143 and 144 are formed from a relatively low-cost material, the module 140 itself can be produced with a reduced cost and that the desired first to fourth wiring layers 147 to 150 can be formed more easily with the printed-circuit board technique. By flattening the surface of the base substrate block 141 by polishing, for example, the high-frequency module 140 can have the passive elements 153 to 155 formed in the element forming layer 142 with a high precision. Also, since the base substrate block 141 and element forming layer 142 are electrically isolated from each other to improve the performance and assure a power circuit etc. having a sufficiently large area, so the high-frequency module 140 can be supplied with a high-regulation power.

Also, in the high-frequency module 140 shown in FIG. 5, the passive elements 153 to 155 formed in the element forming layer 142 are influenced by the ground pattern formed on the first wiring layer 147 at the base substrate block 141. In the high-frequency module 140, the inductor 154, for example, develops a capacitance between itself and the ground pattern to have a reduced self-resonant frequency and quality factor Q. In the high-frequency module 140, the passive elements 153 and 155 also vary or becomes worse in performance.

To solve the problems of the aforementioned conventional high-frequency module 140, there has been proposed another high-frequency module as shown in FIG. 6. The high-frequency module, generally indicated with a reference 160, has pattern openings 161a and 161b formed in the ground pattern on the first wiring layer 147 opposite to the passive elements 153 to 155 at the element forming layer 142. It should be noted that since the components of the high-frequency module 160 in FIG. 6 are the same as those in the high-frequency module 140 shown in FIG. 5, so they are indicated with the same references as those in FIG. 5 and will not be described in detail any longer. Thus, in the high-frequency module 160 shown in FIG. 6, the passive elements 153 to 155 will be influenced by the third wiring layer 149 via the organic substrate layer of the first organic substrate 143 and the prepreg 145, but they will be improved in performance.

In the high-frequency module 140 in FIG. 5 and the one 160 in FIG. 6, each of the organic materials of the first and second organic substrates 143 and 144 is a substrate material formed by integrating a woven glass fabric with each of the first and second organic substrates 143 and 144. Such a substrate material is formed by continuously supplying a woven glass fabric, generally rolled in the form of a roll, into a bath filled with an emulsified organic material, thus saturating the woven glass fabric with the organic material, adjusting the thickness of the organic material-saturated woven glass fabric, drying the woven glass fiber, and make some other process of the woven glass fabric to a desired thickness. Then, the first and second organic substrates 143 and 144 are formed by applying an adhesive to the top or bottom main side of the substrate material as a core, bonding a rolled copper foil having the surface thereof roughened to the substrate material and cutting the latter to a predetermined size.

In the high-frequency module 160 in FIG. 6, since each of the organic substrates is larger in specific inductive capacity than the woven glass fabric, the line pattern 152 of the distributed parameter circuit formed on the base substrate block 141 is influenced in both conductor loss and inductive loss by the woven glass fabric in the aforementioned first and second organic substrates 143 and 144, and thus has the performance thereof degraded. Also, in the high-frequency module 160 in FIG. 6, in case the glass fibers are woven with a large pitch, the line pattern 152 will be formed over a portion where the glass fibers are laid and a portion where no glass fibers exist are laid. In the high-frequency module 160 in FIG. 6, the effective specific inductive capacity and dielectric dissipation factor (Tan δ) "vary" in the first and second organic substrates 143 and 144 depending upon whether or not the glass fibers are laid. The "variation" of the effective specific inductive capacity is found large where the glass fibers are laid thick, and small where the glass fibers are laid thin. Namely, the effective specific inductive capacity varies periodically (with the pitch of the glass fibers) in a range of a difference between the maximum and minimum values.

The high-frequency module 160 shown in FIG. 6 is lower in reliability and yield in some cases because of the degraded performance, larger "variation" and difficult reproducibility of the line pattern 152. Thus, the high-frequency module 160 will be higher in cost because it has to be adjusted after produced. Also, in case the high-frequency module 160 has other lines and various passive elements formed in the base substrate block 141 thereof with the thin film technology in addition to the line pattern 152, the same problems will possibly take place due to increases or "variations" of effective specific inductive capacity and dielectric dissipation factor (Tan δ) under the influence of the glass fibers used to form the organic substrates.

DISCLOSURE OF THE INVENTION

Accordingly, the present invention has an object to overcome the above-mentioned drawbacks of the related art by providing a novel high-frequency module and a novel method of producing the high-frequency module.

The present invention has another object to provide a high-frequency module improved in performance, precision and reliability through reduction of the degradation and variation of each conductive part, caused by the glass fibers as the substrate material, and a method of producing the high-frequency module.

The above object can be attained by providing a high-frequency module including, according to the present invention, a wiring pattern formed in an organic insulative layer and a plurality of conductive parts forming passive elements and distributed parameter elements, which transmit a high-frequency signal. In the high-frequency module, each of the conductive parts is formed correspondingly to an area of the organic insulative layer where no woven glass fabric is laid.

In the above high-frequency module according to the present invention, since each of the conductive parts is formed correspondingly to the area where no woven glass fabric is laid, the effective specific inductive capacity and dielectric dissipation factor (Tan δ) are kept from increasing or "varying" and the performance is thus improved.

Also, the above object can be attained by providing a high-frequency module including, according to the present invention, a base substrate block having formed on a main side of an organic substrate a plurality of wiring layers each including an organic insulative layer and a wiring pattern and having at least the uppermost one of the wiring layers layer flattened to form a buildup surface; and an elements block having formed in the organic insulative layer formed on the main side of the buildup surface of the base substrate block a wiring pattern and a plurality of conductive parts forming passive elements and distributed parameter elements, which transmit a high-frequency signal. In the high-frequency module, each of the conductive parts of the elements block is formed correspondingly to an area of the organic insulative layer where no woven glass fabric is laid.

The above high-frequency module according to the present invention can be produced with a reduced cost since the organic substrate is available at a relatively low price, and the conductive parts forming the passive elements and distributed parameter elements can be formed with an improved precision since the elements block is formed on the flat buildup surface of the base substrate block. In the high-frequency module according to the present invention, since each of the conductive parts is formed correspondingly to an area where no woven glass fabric is laid, the effective specific inductive capacity and dielectric dissipation factor (Tan δ) can be kept from increasing or "varying" and thus the performance and reliability can be improved.

Also, the above object can be attained by providing a method of producing a high-frequency module includes, according to the present invention, steps of forming a base substrate block and an elements block. The base substrate block forming step further includes steps of forming, on a main side of an organic substrate, a plurality of wiring layers each including an organic insulative layer and a predetermined wiring pattern; and forming a buildup surface by flattening at the uppermost one of the wiring layers. The elements block forming step further includes a step of forming, in the organic insulative layer formed on the buildup surface of the base substrate block, a wiring pattern and a plurality of conductive parts forming passive elements and distributed parameter elements, which transmit a high-frequency signal. In this method of producing a high-frequency module, each of the conductive parts of the elements block is formed correspondingly to an area of the organic substrate where no woven glass fabric is laid.

The above method of producing a high-frequency module according to the present invention permits to produce a high-frequency module with a reduced cost since the organic substrate is available at a relatively low price, and the conductive parts forming the passive elements and distributed parameter elements can be formed with an improved precision since the elements block is formed on the flat buildup surface of the base substrate block. The method of producing a high-frequency module according to the present invention permits to keep the effective specific inductive capacity and dielectric dissipation factor (Tan δ) from increasing or "varying" and thus improve the performance and reliability of the high-frequency module since each of the conductive parts is formed correspondingly to an area where no woven glass fabric is laid.

These objects and other objects, features and advantages of the present invention will become more apparent from the following detailed description of the best mode for carrying out the present invention when taken in conjunction with the accompanying drawings.

BRIEF DESCRIPTION OF THE DRAWINGS

FIGS. 1A and 1B show together an inductor provided in the conventional high-frequency module, in which FIG. 1A is a perspective view of the inductor and FIG. 1B is a sectional view of the inductor.

BEST MODE FOR CARRYING OUT THE INVENTION

The present invention will be described concerning embodiments thereof with reference to the accompanying drawings.

The high-frequency module according to the present invention has an information communication function, information storage function, etc. and it is to be used as an ultra-small communication module or the like fixedly installed or removably installed as an option in an electronic apparatus such as a personal computer, mobile phone, portable digital assistant or a portable audio device. Especially, the high-frequency module according to the present invention is used in an appropriate small-scale radio communication system using a carrier frequency band of 5 GHz, for example.

Figure 7:
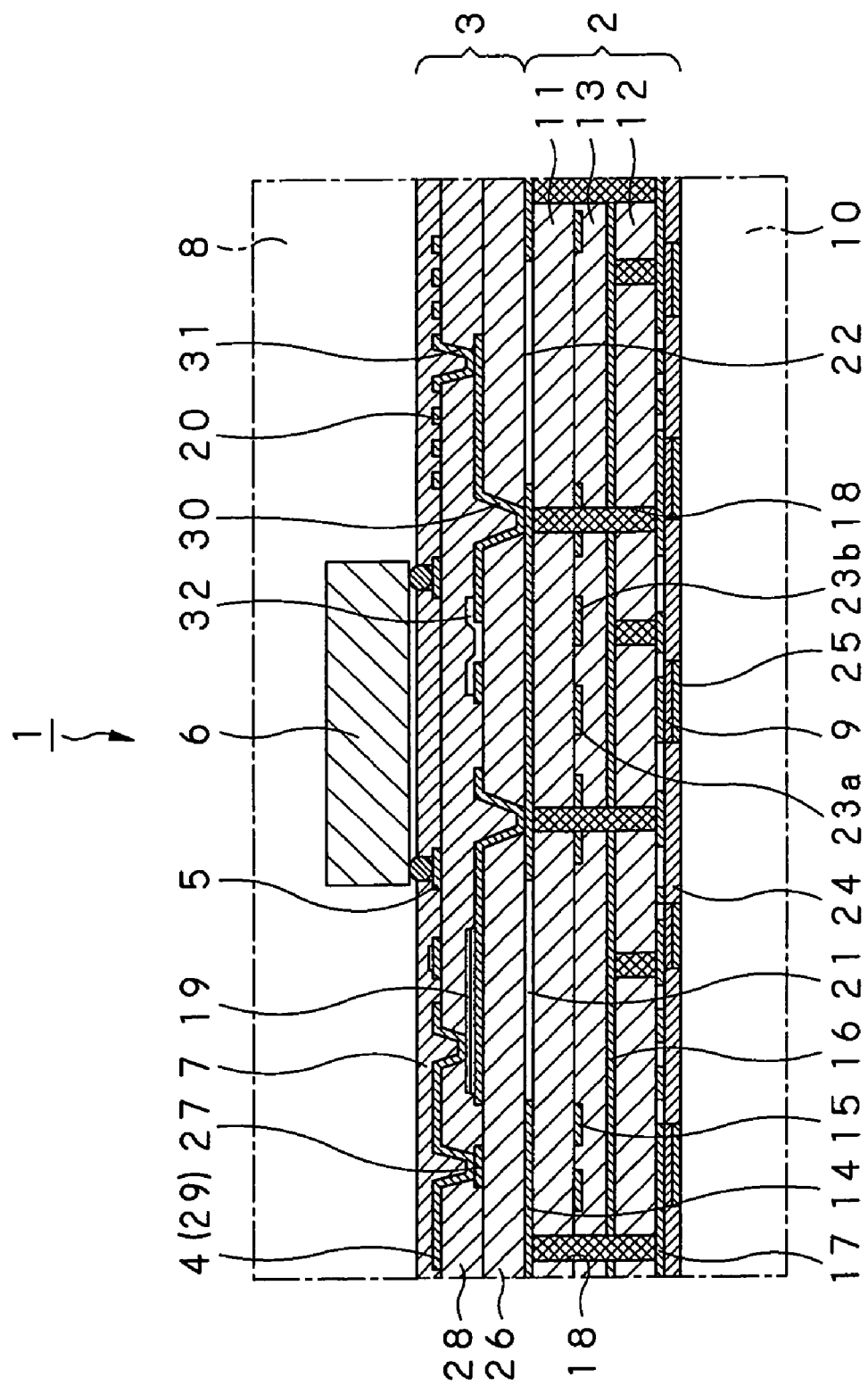
FIG. 7 is an axial sectional view of the substantial part of a high-frequency module according to the present invention.

As shown in FIG. 7, the high-frequency module according to the present invention, generally indicated with a reference 1, includes a base substrate block 2 and an elements block 3 stacked on the base substrate block 2 and having an appropriate wiring pattern 4 and lands 5 formed on the surface thereof. The high-frequency module 1 includes an IC chip 6 having a peripheral circuit function of a high-frequency transmission/reception circuit, electronic parts, etc. (not shown) mounted thereon by the flip chip bonding with the lands 5 laid between them. The wiring pattern 4 formed on the surface of the elements block 3 is covered with an insulative protective layer 7 of solder resist or the like, and the high-frequency module 1 as a whole including the IC chip 6 is covered with an insulative resin layer 8. That is, the high-frequency module 1 is thus packaged. The high-frequency module 1 has multiple terminals 9 formed on the bottom of the base substrate block 2, and is mounted on an interposer substrate 10 (will not be illustrated and described in detail) with the terminals 9 laid between them.

In the high-frequency module 1 according to the present invention, the base substrate block 2 has formed therein circuits such as a power source, control system, etc. for the elements block 3, and also the high-frequency module 1 is mounted at the base substrate block 2 thereof on the interposer substrate 10. In the high-frequency module 1, the base substrate block 2 and elements block 3 are electrically isolated from each other to suppress the electric interference between the base substrate block 2 and elements block 3, thereby assuring an improved performance. Also, in the high-frequency module 1, since the power source and ground, each having a sufficient area are formed in the base substrate block 2, so the power source can supply a power to the elements block 3 with a high regulation.

The base substrate block 2 includes first and second organic substrates 11 and 12 as will be described in detail later. The first and second organic substrates 11 and 12 are bonded integrally to each other with a prepreg 13. That is, the base substrate block 2 has first and second wiring layers 14 and 15 formed therein by patterning the top and bottom main sides of the first organic substrate 11 by photolithography and then removing unnecessary copper foil portions by etching. Similarly, the base substrate block 2 has a total of four layers including third and fourth wiring layers 16 and 17 formed on the upper and lower main sides, respectively, of the second organic substrate 12, in addition to the first and second wiring layers 14 and 15, and the second and first organic substrates 12 and 11 are bonded to each other with the prepreg 13 laid between them. In the base substrate block 2, the first to fourth wiring layers 14 to, 17 are interlayer-connected to each other through via holes 18 appropriately formed.

In the base substrate block 2, the first and third wiring layers 14 and 16 form together a ground layer to shield the second wiring layer 15. The first wiring layer 14 has pattern openings 21 and 22 formed therein in places opposite to a capacitor 19 and inductor 20, respectively, formed in the elements block 3 with the thin film technology as will be described in detail later. The third wiring layer 16 is formed as a so-called solid pattern having a copper foil layer left over the first organic substrate 11. The second wiring layer 15 includes resonator patterns 23a and 23b, for example, formed from a distributed parameter circuit of a strip line structure. The resonator patterns 23a and 23b have an electric length of about λ/4 of the 5 GHz carrier frequency band, that is, a length of about 6 mm, and are short-circuited at one end thereof to the ground and open-circuited at the other end, which will not be described in detail.

The fourth wiring layer 17 is covered with a protective layer 24 of a solder resist or the like, and has openings formed in predetermined places the protective layer 24 by photolithography or the like. In the base substrate block 2, the terminal 9 of the fourth wiring layer 17 exposed from each opening is coated with Ni—Au by solderless plating, for example, to form an electrode 25, and the high-frequency module 1 is mounted on the interposer substrate 10 with the electrodes 25 being laid between them. The base substrate block 2 has a buildup surface formed by flattening the first wiring layer 14 at the first organic substrate 11 and where the elements block 3 is formed by stacking, as will be described in detail later.

The elements block 3 has two layer structures, one including a first dielectric insulative layers 26 and fifth wiring layer 27 stacked on the buildup surface of the base substrate block 2, and the other including a second dielectric insulative layer 28 and sixth wiring layer 29 (wiring pattern 4). In the element forming layer 3, the fifth wiring layer 27 is interlayer-connected to the first wiring layer 14 through viaholes 30 appropriately formed in the first dielectric insulative layer 26, and also the fifth and sixth wiring layers 27 and 29 are interlayer-connected to each other through viaholes 31 appropriately formed in the second dielectric insulative layer 28. The fifth wiring layer 27 has the capacitor 19 and a resistor 32 formed thereon with the thin film technology. The sixth wiring layer 29 has the inductor 20 formed thereon with the thin film technology, and the multiple lands 5 formed thereon.

According to the present invention, the high-frequency module 1 is produced through a step of forming the base substrate block 2, and a step of forming the elements block 3 on the base substrate block 2 by stacking.

The base substrate block forming step will be described with reference to FIGS. 8 to 11.

Figure 2:
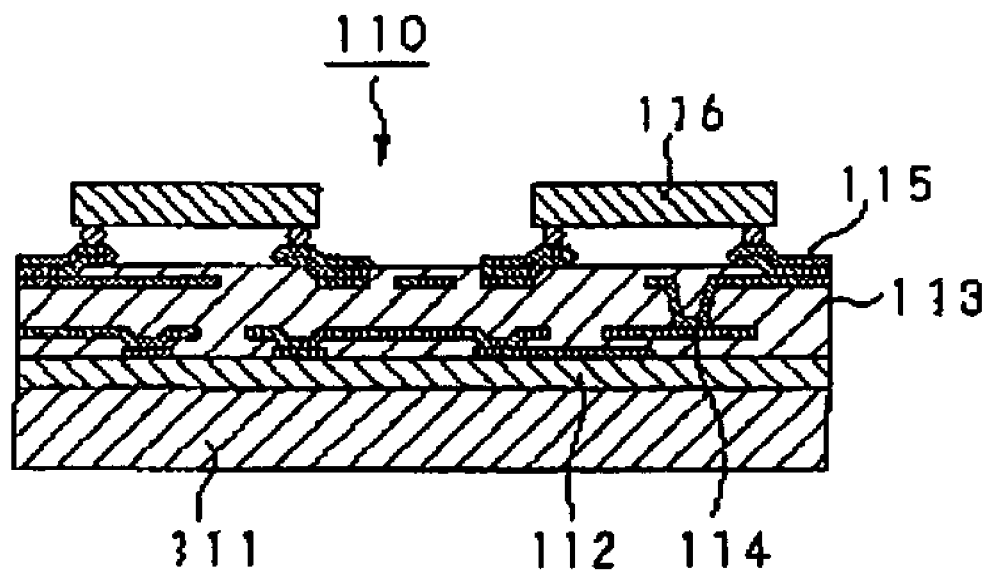
FIG. 2 is an axial sectional view of the substantial part of the conventional high-frequency module using a silicon substrate.
Figure 8:
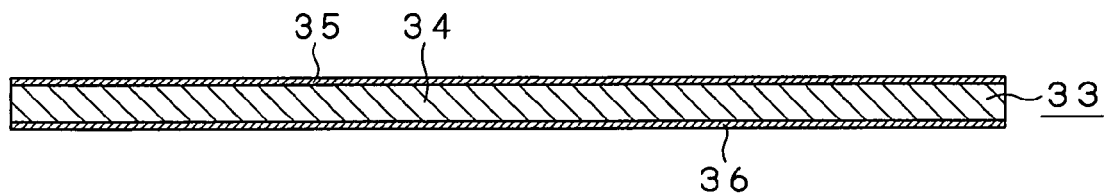
FIG. 8 is also an axial sectional view of the substantial part of an organic substrate used in producing the high-frequency module according to the present invention.

First as shown in FIG. 8, in the base substrate block forming step, an organic substrate material 33 is supplied to form the first and second organic substrates 11 and 12. The organic substrate material 33 includes a core substrate 34, and copper foils 35 and 36 bonded to the top and bottom main sides, respectively, of the core substrate 34 as shown in FIG. 2.

The core substrate 34 is formed from an organic material low in specific inductive capacity and dielectric dissipation factor (Tan δ), that is, superior in high-frequency performance and having a resistance against a temperature higher than 160° C. The core substrate 34 is thus formed from an organic material selected from among liquid crystal polymer (LCP), benzocyclobutene (BCB), polyimide, polynorbornen (PNB), polyphenylether (PPE), polytetrafluoroethylene ("Teflon" as registered trademark), bismaleimide-triazine (BT-resin) or any one of these organic materials having an inorganic material such as ceramic powder or the like dispersed therein.

The core substrate 34 is formed by any appropriate method of molding any of the above-mentioned organic materials melted in an appropriate solvent, for example, by blowing compressed air to the mixture to swell it to have a predetermined shape or pouring the mixture into a tray whose bore is shaped in a predetermined form and inner surface is pre-applied with a release agent or the like and solidifying it by cooling. The above organic substrate material 33 is formed by bonding copper foils 35 and 36 whose surfaces are appropriately roughened to top and bottom main sides, respectively, of the core substrate 34.

In the base substrate block forming step, through-holes are next formed in appropriate positions through the organic substrate material 33. They extend between the top and bottom main sides of the latter. The through-holes are formed in the similar manner to that normally adopted in the conventional multilayer substrate forming step, for example, by forming a through-hole in a predetermined position by a drill or laser, making a copper plating on the wall of the through-hole thus formed to make the through-hole wall electroconductive, embedding a paste in the through-hole and making copper plating of the through-hole to lid the latter. With a wiring pattern being formed on the top and bottom main sides of the organic substrate material 33 by photolithography and etching of the copper foils 35 and 36 to remove other than necessary copper foil portions, the first and second organic substrates 11 and 12 are formed as shown in FIG. 9.

Figure 3:
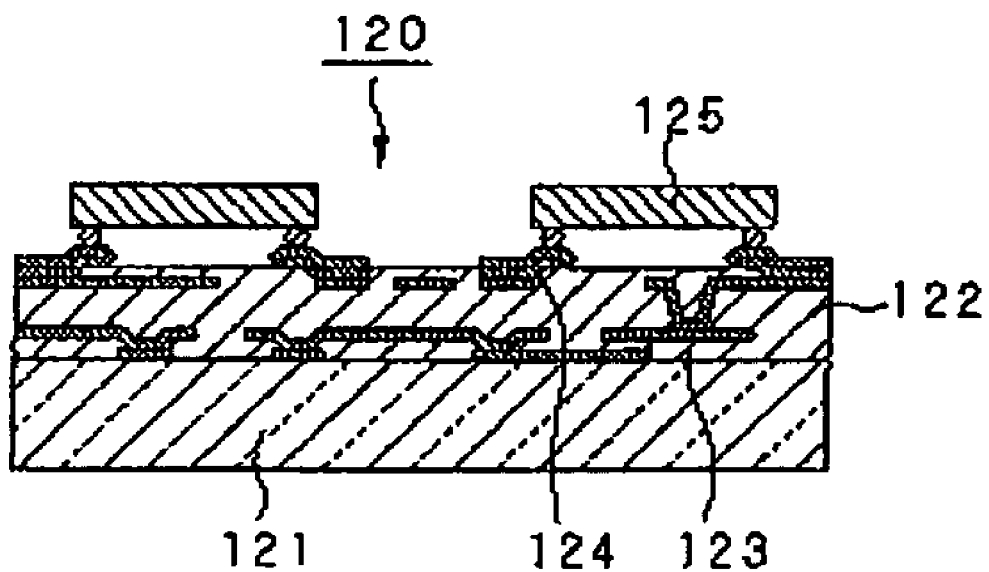
FIG. 3 is also an axial sectional view of the substantial part of the conventional high-frequency module using a glass substrate.
Figure 4:
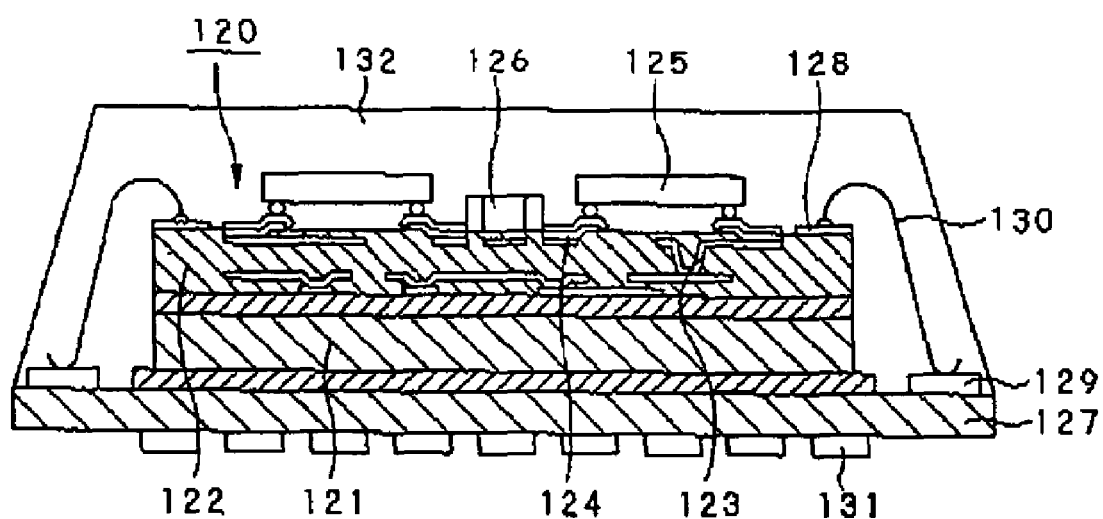
FIG. 4 is an axial sectional view of the substantial part of the conventional high-frequency module used in an interposer.
Figure 5:
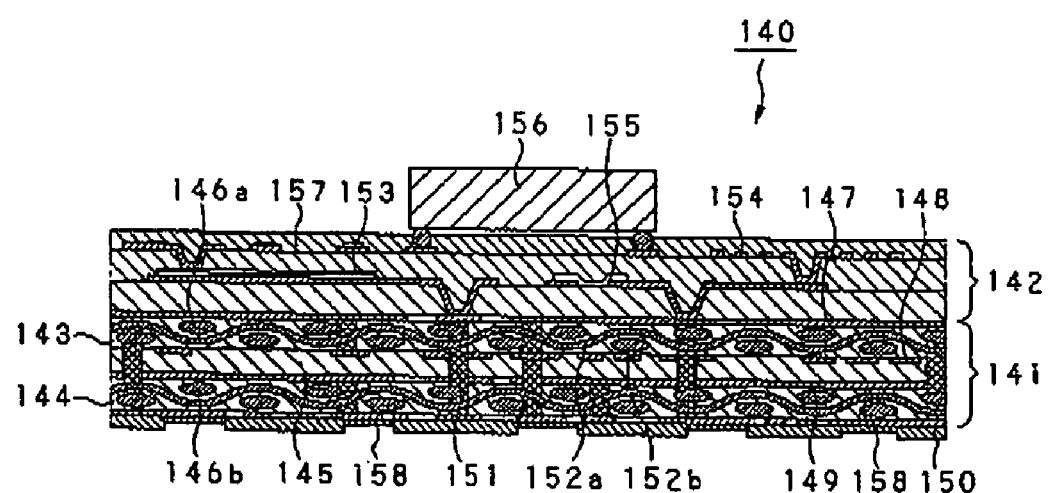
FIG. 5 is an axial sectional view of a high-frequency module in which a high-frequency elements block is formed from a multilayer organic substrate as a base by stacking.
Figure 6:
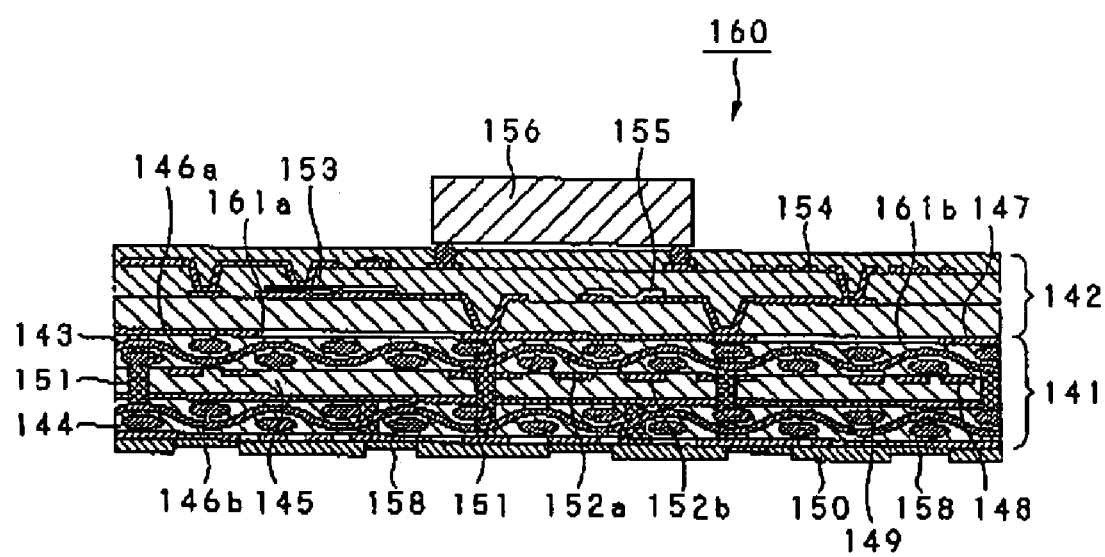
FIG. 6 is an axial sectional view of a high-frequency module having formed in a base substrate block a pattern opening correspondingly to a passive element formed in a high-frequency forming block.
Figure 9:
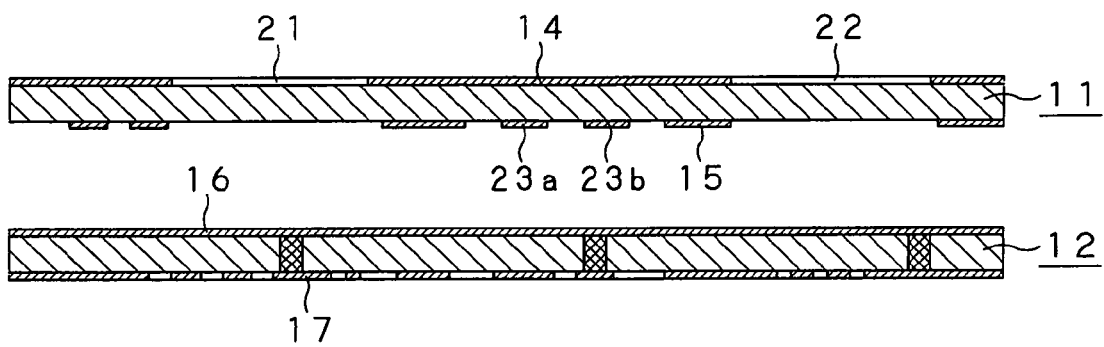
FIG. 9 is an axial sectional view of the substantial part of the high-frequency module according to the present invention, showing the construction of first and second organic substrates.

The first organic substrate 11 has the first wiring layer 14 formed from the copper foil layer on the first main side and the second wiring layer 15 formed from the copper foil layer on the second main side as shown in FIG. 9. The first wiring layer 14 forms a ground layer and has the pattern openings 21 and 22 formed in a portion thereof, as mentioned above. The second wiring layer 15 has a control circuit etc. and strip line-structured resonator patterns 23a and 22b formed thereon as mentioned above. As shown in FIG. 3, the second organic substrate 12 has the third wiring layer 16 formed from the copper foil layer on the first main side, and fourth wiring layer 17 formed from the copper foil layer on the second main side. The third wiring layer 15 has the copper foil left over it to form a ground layer as mentioned above. The fourth wiring layer 17 has formed thereon a wiring pattern which provides a control circuit, power circuit, etc.

Figure 10:
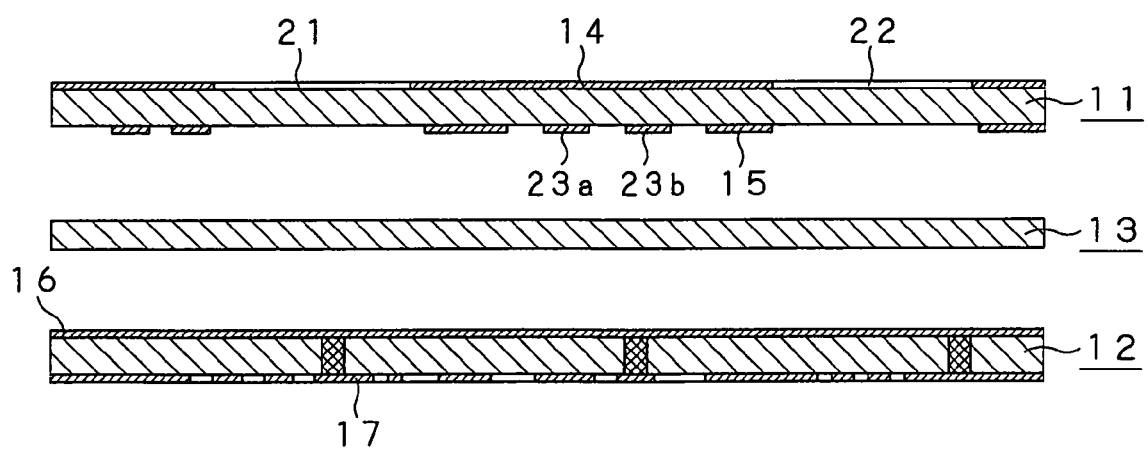
FIG. 10 is an axial sectional view of the substantial part of the high-frequency module according to the present invention, showing the construction of the first and second organic substrates and a prepreg.
Figure 11:
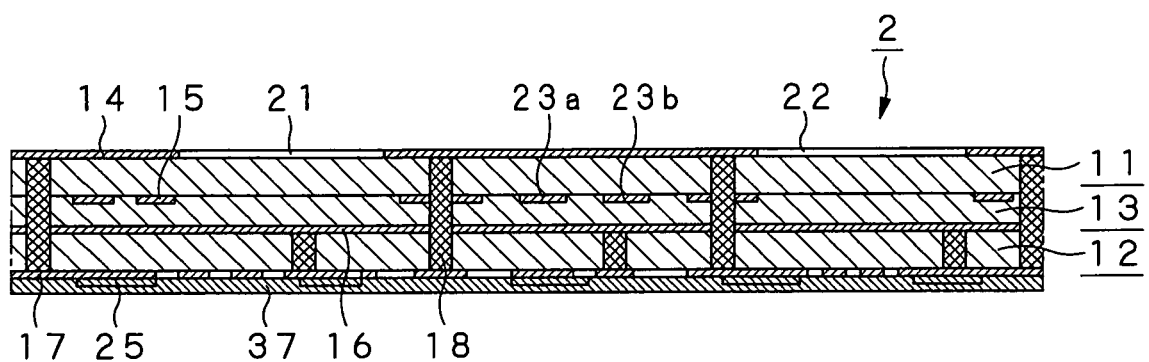
FIG. 11 is an axial sectional view of the substantial part of the high-frequency module according to the present invention, showing a base substrate block including the first and second organic substrates formed integrally with each other with the prepreg being disposed between them.

Next, in the base substrate block forming step, the aforementioned first and second organic substrates 11 and 12 are integrated with each other by the prepreg 13. For the purpose of this integration, the first and second organic substrates 11 and 12 are positioned in relation to each other, the prepreg 13 is interposed between the main sides of the first and second organic substrates 11 and 12 opposite to each other as shown in FIG. 10, and the first and second organic substrates 11 and 12 are subjected to a hot-pressing, for example, to provide a base substrate intermediate. Then, similarly to the above, in the base substrate intermediate, there is formed through the first and second organic substrates 11 and 12 a plurality of through-holes 18 that provide appropriate connections among the first to fourth organic substrates 14 to 17. Thus, the base substrate block 2 is formed as shown in FIG. 11.

Note that the step of forming the base substrate block 2 is not limited to the aforementioned one but the base substrate block 2 may be formed by one of the conventional printed-circuit board techniques with which a insulative layer and wiring layer are formed sequentially on a main side of a both-side copper clad organic substrate, for example, as a base. In this case, the base substrate block 2 is formed by forming a wiring layer on a both-side copper clad organic substrate, then a dielectric insulative layer on the wiring layer by applying a dielectric insulative material to the wiring layer by spin coating, dipping or the like, and predetermined pattern recesses corresponding to a wiring pattern on the dielectric insulative layer with an appropriate technique. The base substrate block 2 may have a buildup surface formed thereon by forming a conductor layer over the dielectric insulative layer by sputtering, for example, and flattening the dielectric insulative layer and the conductor layer in the pattern recesses by chemical polishing or the like. Also, the base substrate block 2 may be formed by bonding a sheet-shaped resin-lined copper foil to either side of a both-side copper clad organic substrate having a copper foil provided on each side thereof and patterned in a specific manner and patterning the resin-lined copper foils. Further, the base substrate block 2 is not limited in structure to the four-layer one but it may have more layers formed therein as necessary.

The base substrate block 2 uses the first and second organic substrates 11 and 12 or the prepreg 13, including no woven glass fabric, as having been described above. The base substrate block 2 includes the aforementioned core substrate 34 formed from an organic material. The core substrate 34 should preferably be formed from an organic material whose softening point is higher than that of the prepreg 13, especially, a thermoplastic resin such as PPE, LCP or PNB. Since the core substrate 34 has no woven glass fabric therein, the base substrate block 2 is low in productivity as compared to the conventional organic substrate using, as a core material, a woven glass fabric that can be formed continuously. However, in the elements block 3 above the base substrate block 2 will have passive elements and wiring patterns formed therein with the thin film technology employed in the semiconductor forming step as will be described in detail later.

Therefore, the base substrate block 2 can surely be formed easily through the manufacturing process and have an improved performance since the core substrate 34 has not to be any large one and is superior in flatness or uniformity owing to the techniques adopted in the process. Thus the base substrate block 2 can be formed with a higher precision and lower cost since the first to fourth wiring layers 14 to 17 are formed from a relatively organic substrate with the well-known printed-circuit board technique as having been described above.

Of the base substrate block 2, the first organic substrate 11 having the first wiring layer 14 formed thereon has at least the main side thereof is flattened. It should be noted that the flattening may be such that the flattening may be done at the same time for the fourth wiring layer 17 in order to equally finish the top and bottom sides of the base substrate block 2 for inhibiting any warping or the like from taking place. At the base substrate block 2, the first wiring layer 14 is covered with an insulative layer having a predetermined thickness, and the insulative layer is surface-flattened by polishing with a polishing agent that is a mixture of alumina and silica, for example, until the first wiring layer 14 appears. The flattened surface of the base substrate block 2 provides a buildup surface on which the elements block 3 is to be formed. Therefore, the base substrate block 2 can have the elements block 3, which will be described in detail later, formed on the buildup surface thereof by stacking with a high precision. It should be noted that the flattening may also be done with any other technique than the polishing, such as the reactive ion etching (RIE) or plasma etching (PE), for example.

In the step of forming the base substrate block 2, an insulative resin layer 37 forming the protective layer 24 is also formed on the fourth wiring layer 17, as shown in FIG. 11, simultaneously with the aforementioned insulative layer covering the first wiring layer 14. The insulative resin layer 37 is polished simultaneously with the polishing of the buildup surface, which is done when polishing the first wiring layer 14. The insulative resin layer 37 is polished to such a limited extent that the fourth wiring layer 17 and each of the electrodes 25 will not be exposed, and so the fourth wiring layer 17 will be protected against an etchant or a mechanical or thermal load in the step of forming the elements block 3, which will be described in detail later. It should be noted that after the elements block 3 is formed, the insulative resin layer 37 will be removed to expose each of the electrodes 25.

The base substrate block 2 formed through the aforementioned steps is subjected to the elements block forming step will further be subjected to the elements block forming step to have the element forming layer 3 formed, by stacking, on the buildup surface having been flattened by polishing.

Figure 12:
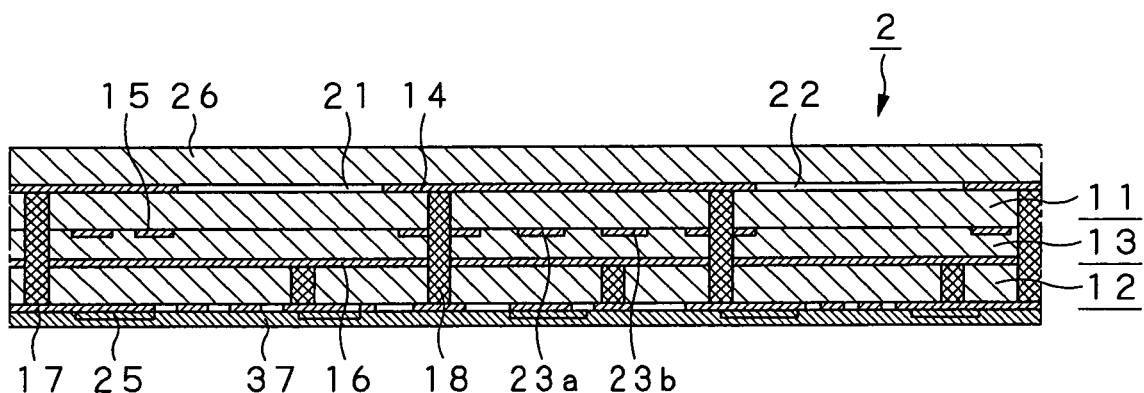
FIG. 12 is an axial sectional view of the substantial part of the high-frequency module according to the present invention, showing a first dielectric insulative layer formed on a first wiring layer of the base substrate to form a first layer of the elements block.

Next, the elements block forming step will be illustrated and described below with reference to FIGS. 12 to 17. In the step of forming the elements block 3, a dielectric insulative material is applied over the buildup surface of the base substrate block 2 to a predetermined thickness to form the first dielectric insulative layer 26 which forms a first one of the layers of the elements block 3 as shown in FIG. 12.

Figure 13:
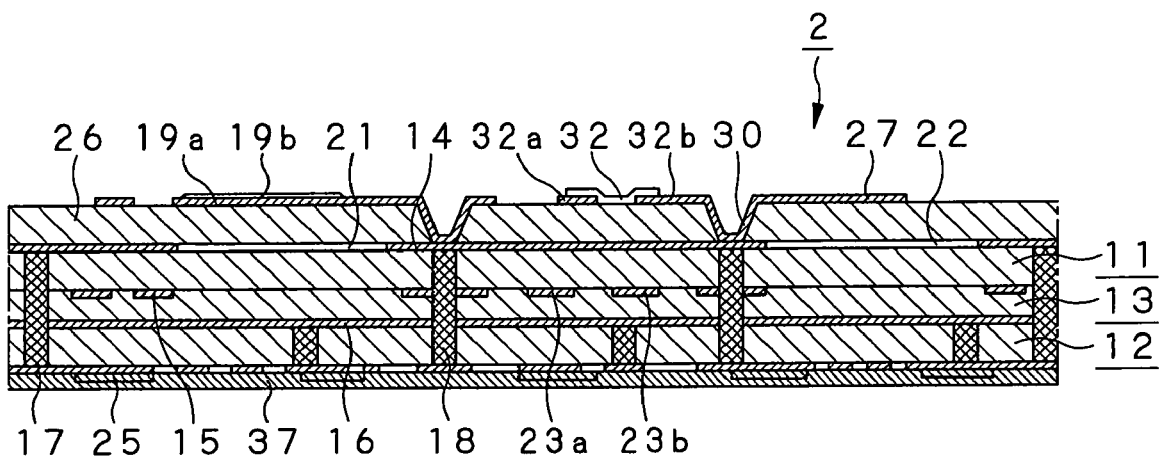
FIG. 13 is an axial sectional view of the substantial part of the high-frequency module according to the present invention, showing a fifth wiring layer formed on the first dielectric insulative layer and then anodized.

As shown in FIG. 13, the first dielectric insulative layer 26 is formed with an appropriate stacking technology capable of forming a layer having a uniform thickness, such as spin coating, roll coating or curtain coating. The first dielectric insulative layer 26 is also formed from an organic material excellent in high-frequency performance, thermal resistance and chemical resistance, such as BCB, PNB, LCP, polyimide or epoxy resin, acrylic resin, polyolefin resin or the like. It should be noted that although the buildup surface is formed by flattening the main side of the base substrate block 2 in the step of forming the high-frequency module 1, it may be formed by flattening the first dielectric insulative layer 26 formed as above.

The first dielectric insulative layer 26 has formed therethrough viaholes 30 through which there is exposed a part of the first wiring layer 14 in the base substrate block 2. In case the first dielectric insulative layer 26 is formed from a photosensitive resin, for example, the viaholes 30 are formed by exposing the first dielectric insulative layer 26 to light after photolithography of the latter with a mast shaped as desired. Also, in case the first dielectric insulative layer 26 is formed from a non-photosensitive resin, for example, the viaholes 30 are formed by dry etching such as a directional chemical etching using a photoresist or metal film having a desired shape as a mask.

The first dielectric insulative layer 26 has a thin metal thin formed over it by sputtering or the like to form the fifth wiring layer 27 thereon. It should be noted that the first dielectric insulative layer 26 may have a priming thin metal film of Cr, Ni, Ti or the like, for example, preformed as a barrier layer thereon by sputtering or the like and then have the thin metal layer formed on the priming thin metal film to improve the adhesion. The thin metal layer is formed from a combination of an Ni layer of about 50 nm in thickness and Cu layer of about 500 nm, or a combination of a Ti layer of about 50 nm and Cu layer of about 500 nm, or the like. The thin metal layer may be formed from Cu, Al, Pt, Au or the like.

The thin metal layer should preferably be formed from a metal selectable in etching the fifth wiring layer 27, as will be descried in detail later. In case the fifth wiring layer 27 is wet-etched with an etchant which is a mixture of nitric acid, sulfuric acid and acetic acid, for example, the thin metal layer is formed from Al, Pt or Au which is resistant against the etchant. Among these metals, Al is most suitable because it can easily be patterned. It should be noted that the thin metal layer is formed on the inner wall of each viahole 30.

The thin metal layer is subjected to photolithography using a mask having a desired shape and then etched to have formed thereon the fifth wiring layer 27 having an under-electrode 19a on which the capacitor 19 is provided and seat-electrodes 32a and 32b on which the resistor 32 is provided as shown in FIG. 13. The fifth wiring layer 27 has formed with the lift-off technique in place on the first dielectric insulative layer 26 a tantalum nitride (TaN) layer of about 2000 angstroms in thickness. It should be noted that the TaN layer may be formed by sputtering the tantalum nitride (TaN) over the entire exposed surfaces of the fifth wiring layer 27 and first dielectric insulative layer 26, and then removing unnecessary portions by dry etching. The TaN layer is formed over the seat-electrodes 32a and 32b to form the resistor 32. The TaN layer acts as a base membrane when forming a dielectric layer 19b of the capacitor 19.

Figure 14:
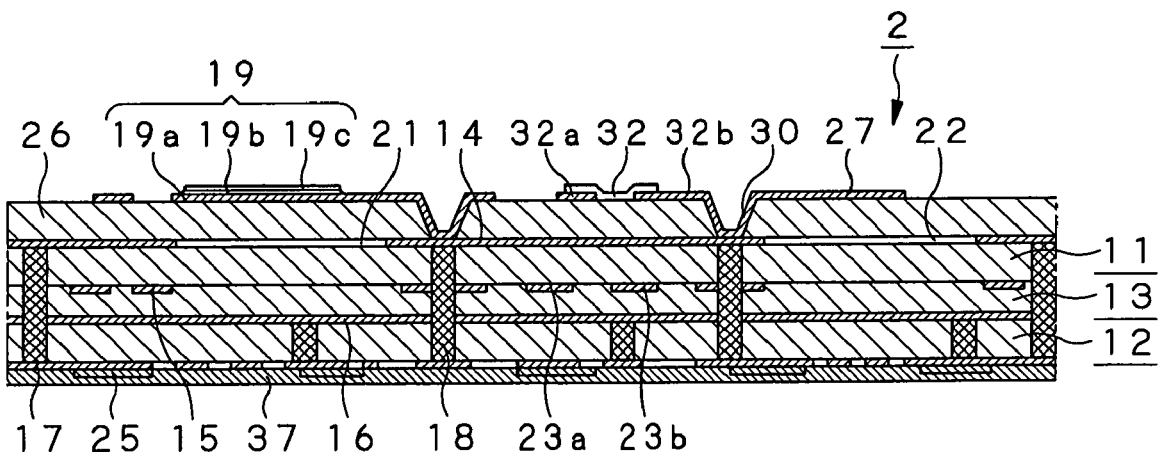
FIG. 14 is an axial sectional view of the substantial part of the high-frequency module according to the present invention, showing capacitor element electrodes formed on the fifth wiring layer.

As shown in FIGS. 13 and 14, the capacitor 19 has the dielectric layer 19b formed by baring the TaN layer formed on the under-electrode 19a, forming, on the fifth wiring layer 27, an anodization mask which covers other portions than the bared TaN layer, applying a voltage to the TaN layer and anodizing the latter to form a tantalum oxide ($Ta_2O_5$) layer. The anodization mask is formed from a photoresist or silicon oxide easy to pattern, for example, to have a thickness of several to several dozen micrometers. This thickness assures a sufficient insulation of other portions from the applied voltage. The TaN layer is anodized in an electrolytic solution of ammonium borate, for example, applied with a voltage of 50 to 200 V to be an anode. Thus the TaN layer is oxidized at selected portions thereof to form a $Ta_2O_5$ layer (dielectric layer 19b). In the step of forming the element forming layer 3, the dielectric layer 19b of the capacitor 19 and register 32 can be formed at the same time through the aforementioned steps.

In the step of forming the element forming layer 3, an upper-electrode 19c is formed on the dielectric layer 19b of the capacitor 19 as shown in FIG. 14. The upper-electrode 19c is formed on the fifth wiring layer 27 by sputtering Ni/Cu or Ti/Cu over the fifth wiring layer 27 except for the dielectric layer 19b, for example. The upper-electrode 19c thus formed has a predetermined thickness and is opposite to the lower-electrode 19a with the dielectric layer 19b laid between them as shown in FIG. 8.

Note that the TaN layer may wholly be anodized without use of any anodization mask and then the resultant $Ta_2O_5$ layer be appropriately patterned. Since the TaN layer of the resistor 32 is also anodized at the surface thereof, the oxide layer will act as a protective layer to maintain a stable performance of the inner TaN layer.

Figure 15:
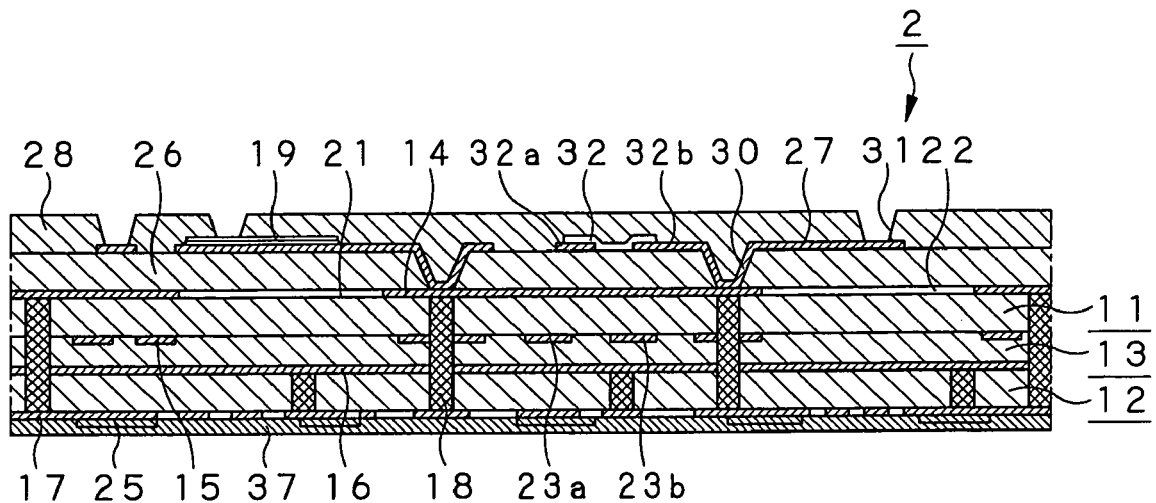
FIG. 15 is an axial sectional view of the substantial part of the high-frequency module according to the present invention, showing a second dielectric insulative layer formed on the fifth wiring layer.

In the step of forming the element forming layer 3, the second dielectric insulative layer 28 is formed with the thin film technology to fully cover the fifth wiring layer 27 after forming the latter through the aforementioned steps, as shown in FIG. 15. Also the second dielectric insulative layer 28 is formed from an organic material excellent in high-frequency performance, thermal resistance and chemical resistance by an appropriate thin film technology capable of forming a layer having a uniform thickness, such as spin coating or the like similarly to the aforementioned first dielectric insulative layer 26. The second dielectric insulative layer 28 is subjected to photolithography, exposure and development, for example, to have formed therethrough viaholes 31 through which there will be exposed appropriate portions of the fifth wiring layer 27 and upper-electrode 19c of the capacitor 19 as shown in FIG. 15.

Figure 16:
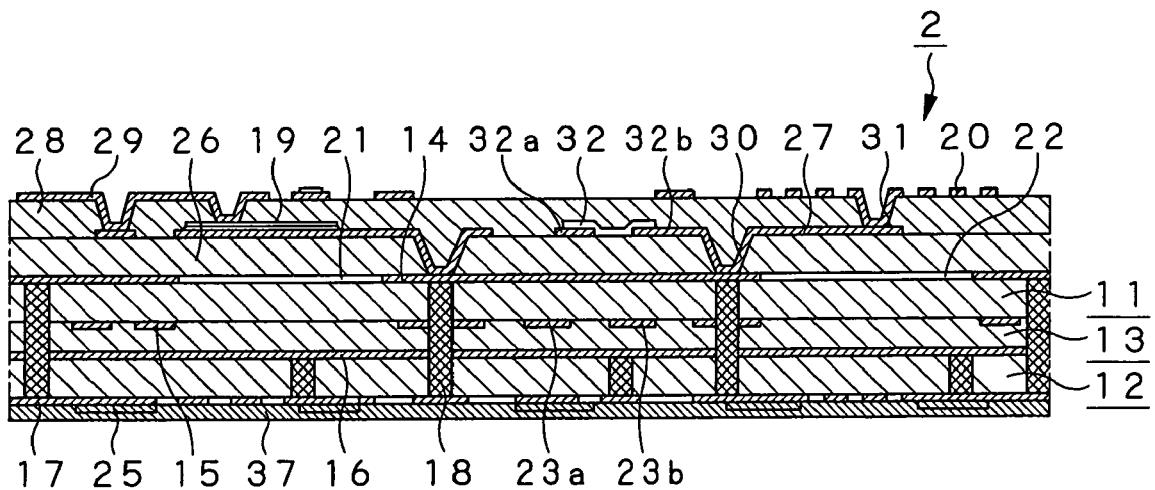
FIG. 16 is an axial sectional view of the substantial part of the high-frequency module according to the present invention, showing a sixth wiring layer formed on the second dielectric insulative layer.

The second dielectric insulative layer 28 has the sixth wiring layer 29 with the inductor 20 formed on the surface thereof through the similar forming steps to those through which the fifth wiring layer 27 has been formed as shown in FIG. 16. The sixth wiring layer 29 is formed through a step in which a thin metal layer of Ni/Cu or Ti/Cu is formed by sputtering or the like on the inner wall of the viahole 31 and over the second dielectric insulative layer 28, a step in which the thin metal layer is subjected to photolithography using a mask having a desired shape, and a step in which the thin metal layer is etched to remove unnecessary thin metal film with a wiring pattern being left.

The sixth wiring layer 29 has the aforementioned inductor 20 formed thereon and is formed larger in thickness than the fifth wiring layer 27 in order to improve the skin effect of the inductor 20. Therefore, in the step of forming the sixth wiring layer 29, the inductor 20 having a predetermined thickness as shown in FIG. 16 with the so-called semi-additive technique in which a Cu layer is formed on a selected portion of the thin metal layer corresponding to the inductor 20 by an electrolytic plating using copper, for example, and then the solder resist is removed, the Ni/Cu layer is wholly etched back by sputtering. The sixth wiring layer 29 is formed thick at a predetermined portion of the wiring pattern corresponding to the land 5, in addition to the inductor 20 formed thereon by the aforementioned electrolytic plating of copper. It should be noted that the inductor 20 is a spiral-shaped one in this embodiment but it may of course be an appropriately-shaped one.

Figure 17:
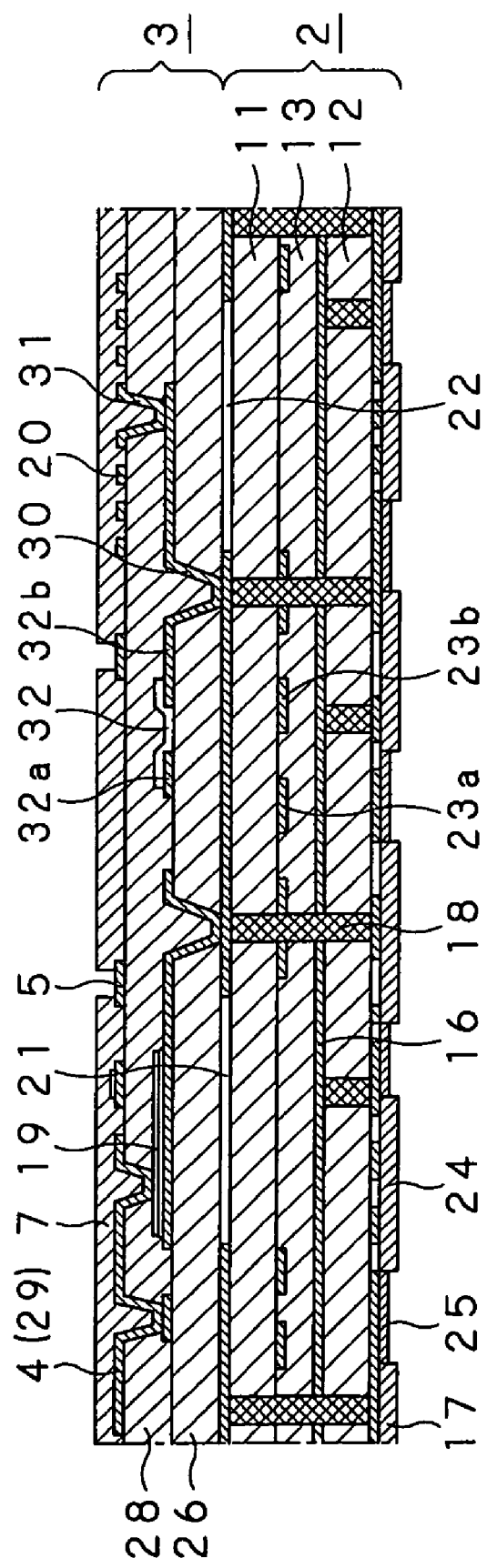
FIG. 17 is an axial sectional view of the substantial part of the high-frequency module according to the present invention, showing an insulative protective layer formed on the sixth wiring layer to form the elements block.

As shown in FIG. 17, the elements block 3 has formed thereon opposite to the pattern openings 21 and 22 formed in the first wiring layer 14 that acts as the ground of the base substrate block 2 the passive elements such as the capacitor 19 and inductor 20 formed through the aforementioned steps. Therefore, the passive elements in the elements block 3 will not have the self-resonant frequency thereof deteriorated by a capacitance developed between them and the ground pattern and the performances thereof deteriorated due to a reduction of the quality factor Q.

The sixth wiring layer 29 is covered with the insulative protective layer 7 as shown in FIG. 17. The insulative protective layer 7 is formed over the sixth wiring layer 29 by spin coating of a solder resist or interlayer insulative material, for example. The insulative protective layer 7 is subjected to photolithography using a mask having a desired shape to have an opening formed therethrough in a place corresponding to each land 5. In the step of forming the elements block 3, the latter is formed to have electrodes by making electroless Ni/Au or Ni/Cu plating, for example, of the lands 5. The element forming layer 3 has the IC chip 6 mounted thereon by flip-chip bonding with the lands 5 laid between them, and has the insulative resin layer 8 formed thereon to cover the IC chip 6, whereby the high-frequency module 1 shown in FIG. 7 is formed.

Note that in the step of forming the high-frequency module 1 according to the present invention, a shielding cover is attached on the elements block 3 to eliminate the effects of an electromagnetic noise. Since a large heat from the IC chip 6 and the like will possibly degrade the performance of the elements block 3 in this case, the high-frequency module 1 may be designed to appropriately dissipate the heat. For this purpose, a resin material excellent in thermal conduction, for example, is provided on the IC chip 6 to dissipate heat from the IC chip 6 at the shielding cover via the resin material or a cooling viahole is formed to provide a communication between the elements block 3 and base substrate block 2 to dissipate such heat at the base substrate block 2.

Also, since in the step of forming the high-frequency module 1, the base substrate block 2 is formed from the organic substrate as a core substrate with the so-called printed-circuit board technique as mentioned above, the high-frequency module 1 can be produced with a reduced costs. Also, since in the step of forming the high-frequency module 1, the elements block 3 is stacked on the flat buildup surface of the base substrate block, the passive elements such as the capacitor 19, inductor 20, etc. can be formed with an improved precision.

Also, since in the step of forming the high-frequency module 1, the base substrate block 2 is formed from the first organic substrate 11, second organic substrate 12 or prepreg 13 using no woven glass fabric as the core material as mentioned above, there can be reduced the high-frequency module 1 in which the dielectric property of the base substrate block 2 can be kept low and the influence of woven glass substrate on the resonator pattern 23 formed as an inner layer is reduced. Also in the step of forming the high-frequency module 1, since the aforementioned base substrate block 2 is included, there can be formed in the elements block 3 the passive elements such as the capacitor 19, inductor 20, etc. whose performance is stable without being affected by the woven glass fabric.

Therefore, the step of forming the high-frequency module 1 assures the high-frequency module 1 which can be produced with an improved yield and such a precision that no post-processing such as adjustment is required. The high-frequency modules 1 thus produced are uniform in quality.

In the aforementioned high-frequency module 1, the base substrate block 2 is formed from the first organic substrate 11, second organic substrate 12 or prepreg 13 using no woven glass fabric as the core material. Since the high-frequency module 1 is multilayer-structured and has the IC chip 6 etc. mounted thereon, it has a practically sufficient mechanical strength, but this mechanical strength is somewhat smaller than the conventional multilayer substrate using the woven glass fabric. In the high-frequency module 1 according to the present invention, in case a woven glass fabric is used in the base substrate block 2, it will only affect a portion of the element forming layer 3 where the passive elements are formed.

Figure 18:
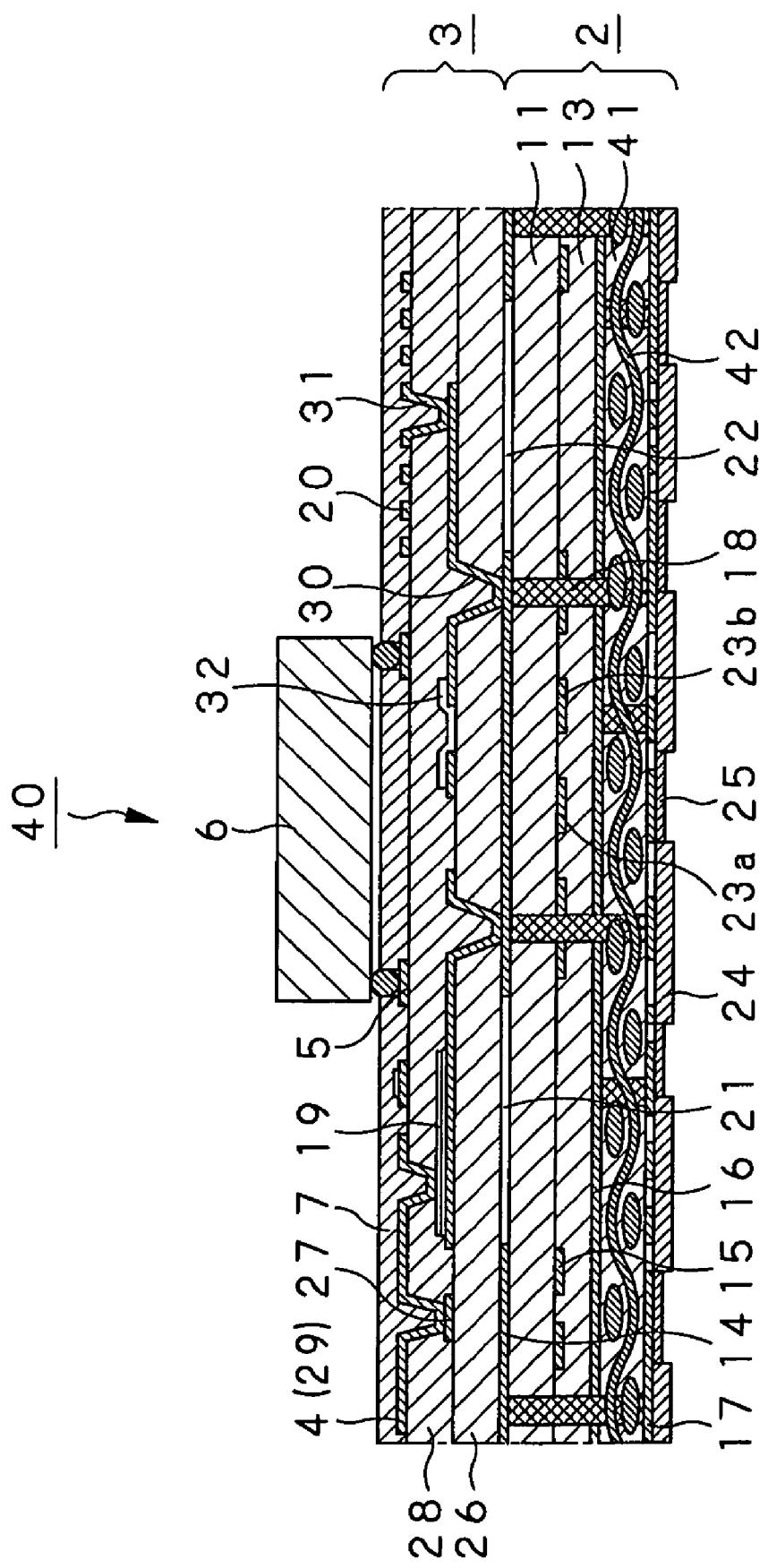
FIG. 18 is an axial sectional view of the substantial part of a second embodiment of the high-frequency module according to the present invention, in which the second organic substrate in the lower portion is formed from an organic substrate including a woven glass fabric as a core.

The second embodiment of the high-frequency module according to the present invention will be described below with reference to FIG. 18. This high-frequency module is generally indicated with a reference 40. As shown in FIG. 18, the high-frequency module 40 has the base substrate block 2 in which a second organic substrate 41 using a woven glass fabric 42 as a core material is used in place of the aforementioned second organic substrate 12 as the lower layer.

Note that since the high-frequency module 40 shown in FIG. 18 is constructed of the same or similar components as or to those in the aforementioned high-frequency module 1 except for the second organic substrate 41, the components will be indicated with the same or similar references as or to those for the components in the high-frequency module 1 and will not be described in detail any more.

In the high-frequency module 40 in FIG. 18, the second organic substrate 41 formed from a both-side copper clad substrate is an integration of an organic material whose specific inductive capacity and loss are low with the woven glass fabric 42 as a core material. The second organic substrate 41 is formed by continuously supplying the woven glass fabric 42, formed by weaving glass fibers into a mesh and rolled in the form of a roll, into a bath filled with an emulsified organic material, thus saturating the woven glass fabric with the organic material, adjusting the thickness of the organic material-saturated woven glass fabric, drying the woven glass fiber, and make some other processing of the woven glass fabric to a desired thickness. Then, the second organic substrate 41 is formed by applying an adhesive to the top or bottom main side of the substrate material as a core, bonding a rolled copper foil having the surface thereof roughened to the substrate material and cutting the latter to a predetermined size.

The second organic substrate 41 has the third and fourth wiring layers 16 and 17 formed by photolithography and etching of each of the top and bottom copper foil layers, and has also through-holes in appropriate places. Since on the second organic substrate 41, the third wiring layer 16 retains the copper foil layer as a ground layer thereover as previously described, the woven glass fabric 42 as the core material is electrically isolated from the resonator pattern 23 formed in the second wiring layer 15 and passive elements formed in the elements block 3 not to directly affect the resonator pattern 23 and passive elements.

The high-frequency module 40 shown in FIG. 18 has electrical properties equal to those of the aforementioned high-frequency module 1 according to the first embodiment of the present invention and also is designed to have an improved mechanical strength. The first organic substrate 11 and elements block 3 in the high-frequency module 40 in FIG. 18 can be formed from an organic material such as an acrylate resin, epoxy resin or polyolefin resin which will still remain relatively soft even after having been cured, for example. That is, the material for the first organic substrate 11 and elements block 3 can be selected with a higher freedom.

The third embodiment of the high-frequency module according to the present invention will be described below with reference to FIG. 19. This high-frequency module is generally indicated with a reference 50 in FIG. 19. The high-frequency module 50 is formed by integrating first and second organic substrates 51 and 52 with a prepreg 53 laid between them, and stacking a third organic substrate 54 integrally on the first organic substrate 51 by build-up or one-operation pressing. The high-frequency module 50 uses a both-side copper clad substrate as the first organic substrate 51, having copper foil layers bonded to top and bottom main sides, respectively, thereof and which form first and second wiring layers 55 and 56, respectively, and also a both-side copper clad substrate as the second organic substrate 52, having copper foil layers bonded to top and bottom main sides, respectively, thereof and which form third and fourth wiring layers 57 and 58, respectively. Also, the high-frequency module 50 uses a one-side copper clad substrate as the third organic substrate 54, having a copper foil layer bonded to one main side thereof and which forms a fifth wiring layer 59 that is the uppermost layer in the high-frequency module 50.

Figure 19:
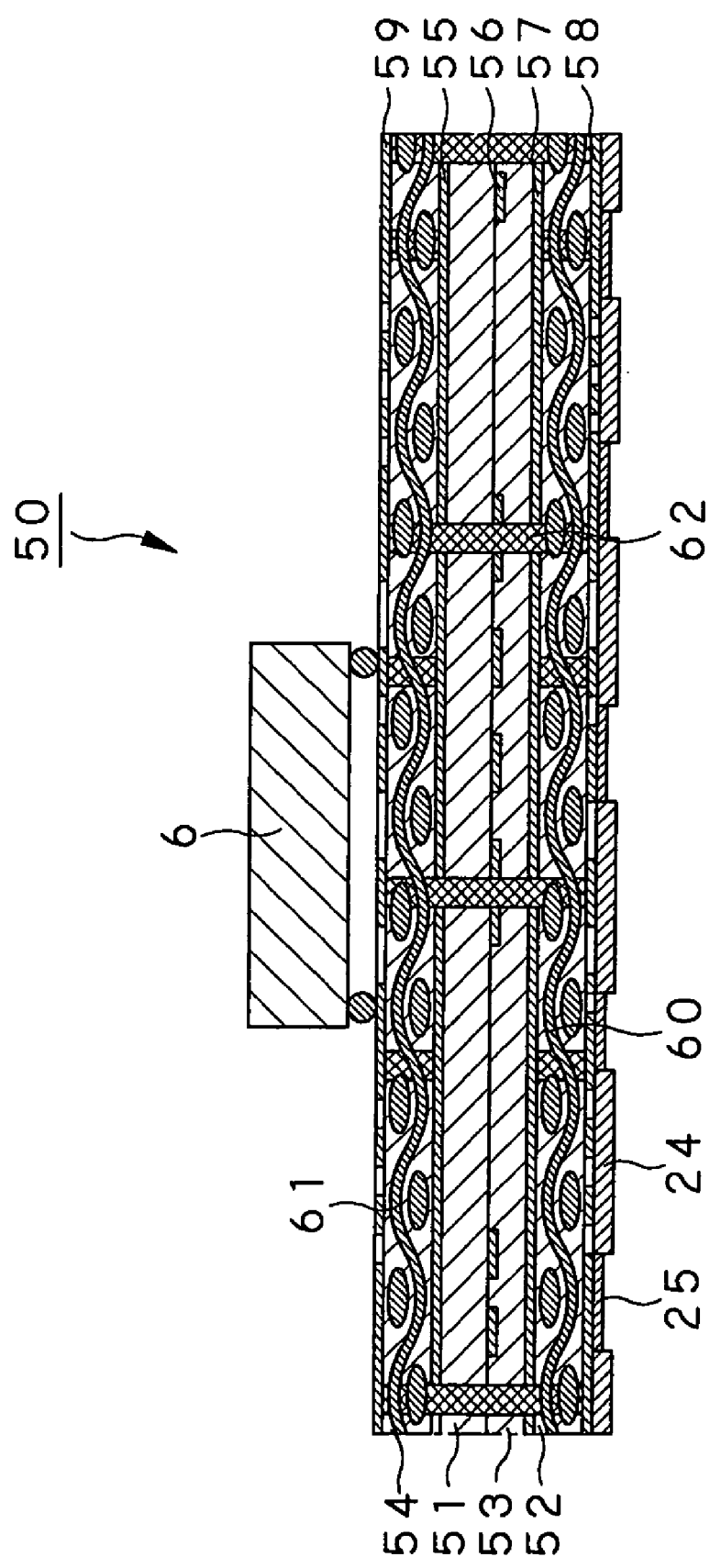
FIG. 19 is an axial sectional view of the substantial part of a third embodiment of the high-frequency module according to the present invention, in which a strip-line structure of lines is formed on organic substrates without the woven glass fabric which is laid between the organic substrates including the woven glass fabric as a core.

In the high-frequency module 50 shown in FIG. 19, the second and third organic substrates 52 and 54 include woven glass fabrics 60 and 61 as core material integrated thereto, respectively. Also in the high-frequency module 50, the first organic substrate 51 and prepreg 53 include no woven glass fabric. In the high-frequency module 50, the first to third organic substrates 51, 52 and 54 are stacked integrally on each other with a predetermined wiring pattern being formed in each of the copper foil layers in the first to third organic substrates 51, 52 and 54. The high-frequency module 50 has a plurality of through-holes 62 formed through the organic substrates stacked integrally on each other.

The first wiring layer 55 forms a ground layer with the copper foil being left over the first organic layer 51. The second wiring layer 56 is formed by photolithography and etching of the copper foil layer under the first organic substrate 51. The second wiring layer 56 forms a wiring for the control system, for example, and is enclosed by the first and third wiring layers 55 and 57 as the upper and lower ground layers to provide internal strip-line structure lines. These strip-line structure lines form a resonator, filter or coupler.

The third wiring layer 57 forms a ground layer with the copper foil layer being left over the second organic substrate 52. The fourth wiring layer 58 is formed by photolithography and etching of the copper foil layer under the second organic substrate 52. The fourth wiring layer 58 forms a wiring for the control system, for example, and has multiple electrodes 25 formed thereon as in the aforementioned high-frequency module 1. The high-frequency module 50 is thus mounted on an interposer (not shown). In the high-frequency module 50 shown in FIG. 19, the fifth wiring layer 59 is formed by photolithography and etching of the copper foil layer on the third organic substrate 54 stacked on the first organic substrate 51. In the high-frequency module 50, multiple lands 5 are formed on the fifth wiring layer 59, and the IC chip 6, chips (not shown), etc. are mounted on the fifth wiring layer with the lands 5 laid between them. It should be noted that the fifth wiring layer 59 is covered with the insulative protective layer 7 for the purpose of protection.

To have an improved mechanical strength, the uppermost and lower most layers of the high-frequency module 50 shown in FIG. 19 are formed from the second and third organic substrates 52 and 54, respectively, including the woven glass fabrics 60 and 61 as the core materials, respectively, as mentioned above. In the high-frequency module 50, the elements such as the resonator, filter or coupler formed from the strip-line structure line are formed on the second wiring layer 56 as an inner layer laid between the first and third wiring layers 55 and 57 as the ground layers, respectively, and thus the elements are electrically isolated from the woven glass fabric. Therefore, in the high-frequency module 50, the elements are kept stable in performance without being affected by the woven glass fabrics 60 and 61 in the second and third organic substrates 52 and 54.

Note that the structure of the high-frequency module 50 in FIG. 19 is not limited to the aforementioned one but multiple organic substrates are stacked integrally on one each other. In the high-frequency module 50, the passive elements such as the capacitor, inductor, etc. may be formed, with the thin film technology, in the wiring layers formed in a multilayer structure. In this high-frequency module 50, the massive elements are formed on an organic substrate including no woven glass fabric and which is enclosed by the ground layers similarly to the aforementioned strip-line structure line.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

INDUSTRIAL APPLICABILITY

In the high-frequency modules according to the present invention, conductive parts are formed where no woven glass fabric is provided so that the conductor parts will not be influenced by the woven glass fabric and can thus have stable and improved performance characteristic. Also according to the present invention, the high-frequency modules are formed from relatively low-cost organic substrates, which leads to a reduction of manufacturing cost. Since the elements block is formed on the flat buildup surface of the base substrate block, the conductive parts of the passive elements, distributed parameter elements, etc. can be formed with a high precision.

The invention claimed is:

1. A high-frequency module comprising:
a first organic substrate having no glass fibers with conductive portions formed on top and bottom surfaces of the first organic substrate;
a second organic substrate having conductive portions formed on top and bottom surfaces of the second organic substrate;
a prepreg layer having no glass fibers exclusively located between the first and second organic substrates;
an insulating layer formed over the conductive portions formed at the top surface of the first organic substrate and wherein high frequency circuit components are formed over the insulating layer and there is no conductive portion on either the top or bottom surfaces of the first organic substrate located perpendicularly below high frequency circuit components that are formed over the insulating layer;
a high frequency integrated circuit located above the high frequency components and wherein conductors transmit electrical signals through the first and second organic substrates and the prepreg layer to conductive pads located beneath the second organic substrate.

2. The high-frequency module according to claim 1, wherein said first organic substrate is formed from either liquid crystal polymer or liquid crystal polymer having a ceramic powder dispersed therein.

3. The high-frequency module according to claim 1, wherein said first organic substrate is formed from either benzocyclobutene or benzocyclobutene having a ceramic powder dispersed therein.

4. The high-frequency module according to claim 1, wherein said first organic substrate is formed from either polynorbornen or polynorbornen having a ceramic powder dispersed therein.

5. The high-frequency module according to claim 1, wherein said first organic substrate is formed from either polyphenylether or polyphenylether having a ceramic powder dispersed therein.

6. The high-frequency module according to claim 1, wherein said first organic substrate is formed from either polytetrafluoroethylene or polytetrafluoroethylene having a ceramic powder dispersed therein.

7. The high-frequency module according to claim 1, wherein said first organic substrate is formed from either bismaleimide-triazine or bismaleimide-triazine having a ceramic powder dispersed therein.

8. The high-frequency module according to claim 1, wherein said first organic substrate is formed from polyimide having a ceramic powder dispersed therein.

9. The high frequency module of claim 1, wherein the second organic substrate has glass fibers located therein.

10. The high frequency module of claim 1, wherein the second organic substrate has no glass fibers located therein.

11. A method of manufacturing a high-frequency module comprising:
providing a first organic substrate having no glass fibers with conductive portions formed on top and bottom surfaces of the first organic substrate;
providing a second organic substrate having conductive portions formed on top and bottom surfaces of the second organic substrate;
forming a prepreg layer having no glass fibers exclusively located between the first and second organic substrates having the conductive portions formed thereon;
forming an insulating layer over the conductive portions formed at the top surface of the first organic substrate and forming high frequency circuit components over the insulating layer and wherein there is no conductive portion on either the top or bottom surfaces of the first organic substrate located perpendicularly below high frequency circuit components that are formed over the insulating layer;
providing a high frequency integrated circuit above the high frequency components and wherein conductors transmit electrical signals through the first and second organic substrates and the prepreg layer to conductive pads located beneath the second organic substrate.

* * * * *